United States Patent
Yamaguchi et al.

(10) Patent No.: US 6,642,082 B2
(45) Date of Patent: Nov. 4, 2003

(54) METHOD FOR MANUFACTURING A RESIN-SEALED SEMICONDUCTOR DEVICE

(75) Inventors: Yukio Yamaguchi, Otsu (JP); Yoshinori Sato, Joetsu (JP); Fumihiko Kawai, Kyoto (JP)

(73) Assignee: Matsushita Electric Industrial Co., LTD (JP)

( * ) Notice: Subject to any disclaimer, the term of this patent is extended or adjusted under 35 U.S.C. 154(b) by 0 days.

(21) Appl. No.: 10/038,901

(22) Filed: Jan. 8, 2002

(65) Prior Publication Data

US 2003/0003627 A1 Jan. 2, 2003

(30) Foreign Application Priority Data

Jun. 28, 2001 (JP) .......................... 2001-195956

(51) Int. Cl.[7] .................. H01L 21/44; H01L 21/48; H01L 21/50
(52) U.S. Cl. ................... 438/112; 438/124; 438/127
(58) Field of Search .................. 438/112, 124, 438/127, 123, 106

(56) References Cited

U.S. PATENT DOCUMENTS

| | | | | |
|---|---|---|---|---|
| 5,652,184 A | * | 7/1997 | Goto et al. ................ | 438/122 |
| 6,025,640 A | * | 2/2000 | Yagi et al. ................ | 257/666 |
| 6,144,108 A | * | 11/2000 | Ohizumi et al. ........... | 257/793 |
| 6,166,430 A | * | 12/2000 | Yamaguchi ................ | 257/666 |
| 6,204,554 B1 | * | 3/2001 | Ewer et al. ................ | 257/705 |
| 6,338,984 B2 | * | 1/2002 | Minamio et al. .......... | 438/123 |
| 6,437,429 B1 | * | 8/2002 | Su et al. ................... | 257/666 |
| 6,448,633 B1 | * | 9/2002 | Yee et al. .................. | 257/666 |
| 6,455,356 B1 | * | 9/2002 | Glenn et al. ............... | 438/123 |
| 2001/0008775 A1 | * | 7/2001 | Yamamoto ................. | 438/106 |
| 2002/0020907 A1 | * | 2/2002 | Seo et al. .................. | 257/687 |

* cited by examiner

Primary Examiner—John F. Niebling
Assistant Examiner—Angel Roman
(74) Attorney, Agent, or Firm—Nixon & Peabody LLP; Donald R. Studebaker

(57) ABSTRACT

A heat plate includes projections for supporting half-etched portions of first signal connection leads, respectively. A lead frame having a resin film mounted thereon is mounted on the heat plate, and thin metal wires are respectively connected to the half-etched portions of the first signal connection leads. Even when the thin metal wire is connected to the half-etched portion of each first signal connection lead, pressing force and heat can be effectively applied to the connection.

6 Claims, 9 Drawing Sheets

CHIP POSITION

METHOD FOR MANUFACTURING A RESIN-SEALED SEMICONDUCTOR DEVICE

BACKGROUND OF THE INVENTION

The present invention relates to a method for manufacturing a resin-sealed semiconductor device including half-etched leads.

Recently, in order to deal with miniaturization of the electronic equipments, semiconductor components mounted on the electronic equipments need be mounted at a high density. In response to such a need, improvement in performance as well as reduction in size and thickness of the semiconductor components have been accelerated.

Conventionally, in order to mount the semiconductor devices on a printed board surface at a high density, a semiconductor chip incorporating elements such as transistors is sealed in a square or rectangular sealing resin, thereby forming a resin-sealed semiconductor device. QFP (quad flat package) technology, i.e., technology of arranging a multiplicity of gull-wing-shaped external lead terminals on the side surfaces of the package, has been widely used for such a resin-sealed semiconductor device. The QFP technology is also required to increase the number of external lead terminals in order to deal with improved performance (improved LSI (Large Scale Integration)) of the semiconductor chip. In this case, in order to increase the number of external lead terminals without increasing the outside dimensions of a QFP, narrow-pitch QFPs having a terminal pitch of 0.3 mm are now partially used for practical applications. However, manufacturing and mounting of such a narrow-pitch QFP have not been successful due to the problems such as reduced yield and degraded quality resulting from bending of the leads. Moreover, the QFP technology is encountering many obstacles to reduction in size.

Recently, the following method was proposed in order to implement improvement in performance as well as reduction in size and thickness: the lower portion of each lead is partially removed by half etching. In the resin sealing step, a resin film is pressed against the lower surface of the whole lead frame so as to expose from the sealing resin the lower portion of each lead except for the half-etched portion. The exposed portion of each lead is used as an external terminal.

In the conventional resin-sealed semiconductor device including leads each having a half-etched portion, wire bonding of the leads is generally conducted by connecting a thin metal wire to each lead at a position right above an external terminal, that is, right above a non-half-etched portion, in order to effectively apply to the thin metal wire the pressing force required to connect the thin metal wire to the lead.

However, recent improvement in performance and reduction in size of the semiconductor devices is making it difficult to conduct wire bonding while preventing the metal wires connected to the respective leads from contacting each other. More specifically, during wire bonding, the tip of a bonding tool moves to form a complicated locus. Therefore, a substantial space is required between the metal wires, and also crossing of the metal wires as viewed two-dimensionally must be prevented as much as possible.

Arranging the external terminals exposed from the back surface of the sealing resin (i.e., the lower portions of the leads) in a plurality of lines so as to achieve a high mounting density of the external terminals noticeably causes the aforementioned problems. For example, such arrangement results in a very narrow space between the metal wires connected to the leads at a position right above the respective external terminals, or necessitates crossing of the thin metal wires. In particular, there may be a case where external terminals are to be provided also under the semiconductor chip. In such a case, the thin metal wires cannot be connected to the leads at a position right above the respective external terminals. Therefore, it is actually impossible to satisfy such a requirement.

The steps prior to the resin sealing step may be conducted with a resin film attached in advance to a lead frame. In such a case, however, it is more difficult to apply to the half-etched portion of the lead the pressing force required to connect the thin metal wire to the lead.

SUMMARY OF THE INVENTION

It is an object of the present invention to avoid the problems associated with wire bonding of a resin-sealed semiconductor device while allowing for increase in the number of external terminals each formed from a part of a corresponding lead.

A method for manufacturing a resin-sealed semiconductor device according to the present invention includes the steps of: (a) preparing a lead frame including a die pad on which a semiconductor chip is mounted, a frame arranged outside the die pad, and a plurality of leads extending from the frame toward the die pad and each including a half-etched portion; (b) mounting on the die pad of the lead frame the semiconductor chip including a plurality of electrode pads; (c) mounting the lead frame having the semiconductor chip mounted thereon on a jig including projections for supporting the half-etched portions of the leads to which thin metal wires are respectively connected out of the half-etched portions of the plurality of leads; (d) connecting the electrode pads of the semiconductor chip to the plurality of leads by the thin metal wires, respectively; and (e) resin-sealing the semiconductor chip, the die pad, the leads and the thin metal wires with a resin film being pressed against a lower surface of the lead frame. In the step (d), the half-etched portions to which the thin metal wires are connected are supported by the projections of the jig, respectively.

According to this method, of the plurality of leads, each of the leads to which a thin metal wire is connected at the half-etched portion has a corresponding projection of the jig located under the half-etched portion when the thin metal wires are connected to the leads in the step (d). Accordingly, wire bonding can be reliably conducted with the pressing force effectively applied to the thin metal wire. Moreover, limitations on the position in each lead where the thin metal wire is connected are reduced, enabling the number of leads to be increased or the positions of the leads to be changed in various ways while avoiding the problems in the wire bonding. This allows for reduction in size of a resin-sealed semiconductor device with improved performance.

The step (d) may be conducted with the heated jig. This enables the thin metal wires to be easily connected to the leads in a reliable manner in the wire bonding step.

The resin film may be mounted to the lower surface of the lead frame prior to the step (c), and the step (d) may be conducted with the resin film being mounted to the lower surface of the lead frame. This enables the resin sealing step to be conducted with a plurality of semiconductor chips mounted in a single die cavity of a sealing mold, allowing the mounting step using the resin film to be conducted with improved efficiency.

In the step (d), the jig including a vacuuming opening may be used to draw the resin film toward a surface of the jig by vacuuming. This enables the problems due to slacking in the resin film to be avoided.

In the step (d), the die pad of the lead frame may be raised upward. This enables wire bonding to be conducted with the resin film being stretched more reliably.

A material having a thermal expansion coefficient of 5 to 25×10 ppm/° C. may be used as the resin film. This enables slacking in the resin film to be suppressed within a proper range even when the resin film is heated by the jig in the step (d).

In the step (a), an upper surface of the die pad of the lead frame may be located higher than respective upper surfaces of the leads. Preparing such a lead frame enables the leads to be extended to a position under the semiconductor chip, whereby the range in which the external terminals may be arranged can be increased.

In the step (a), the plurality of leads of the lead frame may be arranged such that respective lower portions of the plurality of leads except for the half-etched portions are arranged in a plurality of lines when viewed from a back surface of the sealing resin. This enables mounting of a resin-sealed semiconductor device with improved performance.

DESCRIPTION OF THE PREFERRED EMBODIMENTS

Figure 1A:
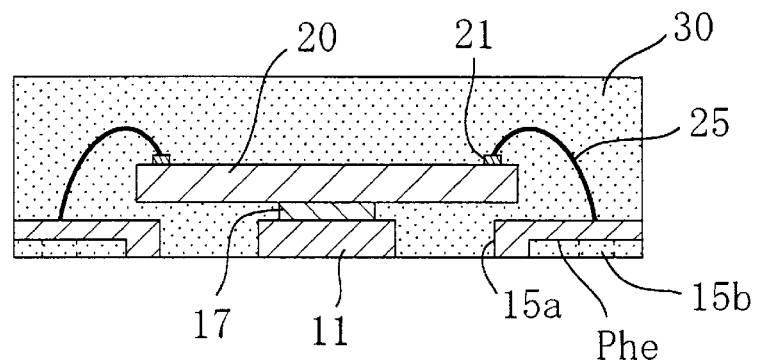
FIG. 1A is a cross-sectional view of a resin-sealed semiconductor device according to an embodiment of the present invention taken along line Ia—Ia in FIG. 1B.
Figure 1B:
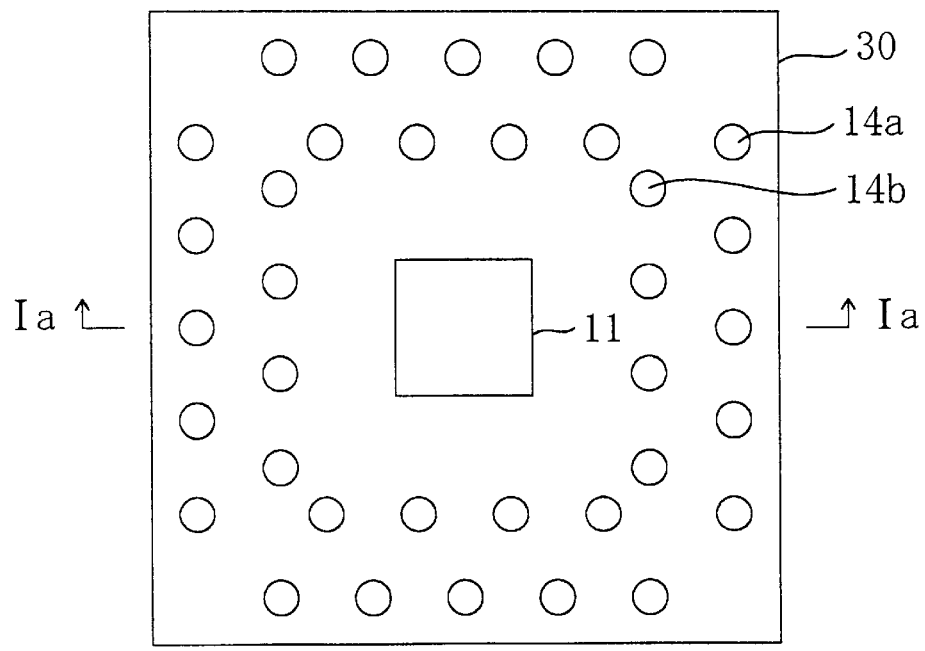
FIG. 1B is a bottom view of the resin-sealed semiconductor device according to the embodiment of the present invention.

FIG. 1A is a cross-sectional view of a resin-sealed semiconductor device according to an embodiment of the present invention taken along line Ia—Ia in FIG. 1B. FIG. 1B is a bottom view of the resin-sealed semiconductor device according to the embodiment of the present invention.

As shown in FIGS. 1A and 1B, the resin-sealed semiconductor device of the present embodiment includes a die pad 11, a multiplicity of first signal connection leads 14a and a multiplicity of second signal connection leads 14b both extending near the die pad 11, a rather thick adhesive layer 17 formed on the die pad 11, a semiconductor chip 20 fixed to the die pad 11 by the adhesive layer 17 and including a multiplicity of electrode pads 21, thin metal wires 25 for electrically connecting the electrode pads 21 on the semiconductor chip 20 to the signal connection leads 14a, 14b, respectively, and a sealing resin 30 for sealing the die pad 11, signal connection leads 14a, 14b, semiconductor chip 20, thin metal wires 25 and the like. The lower portion of each of the first and second signal connection leads 14a, 14b is partially removed by half etching. The residual portion that remains after half-etching the lower portion is herein referred to as half-etched portion Phe. The lower end face of the non-half-etched portion of each of the first and second signal connection leads 14a, 14b is exposed without being covered with the sealing resin 30. These portions are first and second external terminals 15a, 15b. The respective tips of the first and second signal connection leads 14a, 14b are located directly under the semiconductor chip 20. In other words, the semiconductor chip 20 overlaps the first and second signal connection leads 14a, 14b as viewed two-dimensionally.

As shown in FIG. 1B, the die pad 11 and the first and second external terminals 15a, 15b arranged in two lines are exposed from the back surface of the resin-sealed semiconductor device without being covered with the sealing resin 30, so that the respective lower surfaces of the first and second external terminals 15a, 15b serve as connection surfaces with a mounting board such as a printed circuit board.

In the resin sealing step described below, resin is introduced into a die cavity with a resin film being attached to the lower surface of a lead frame. This prevents a resin bur resulting from excessive resin from being formed at the exposed portion of the die pad 11 and the respective lower surfaces of the first and second external terminals 15a, 15b in the resin sealing step, improving reliability of the connection between the external terminals 15a, 15b and electrodes of the mounting board. Since a part of the sealing resin 30 is present under the respective half-etched portions Phe of the signal connection leads 14a, 14b, the signal connection leads 14a, 14b are held with the sealing resin 30 with improved holding power, resulting in improving reliability of the resin-sealed semiconductor device.

According to the resin-sealed semiconductor device of the present embodiment, the thin metal wires 25 are connected to the respective half-etched portions Phe of the first signal connection leads 14a. As described below, the thin metal wires 25 are connected to the first signal connection leads 14a while making sure that the pressing force applied between the thin metal wires 25 and the first signal connection leads 14a works effectively. This allows for excellent reliability of the connection between the thin metal wires 25 and the signal connection leads 14a, 14b.

Accordingly, the resin-sealed semiconductor device of the present embodiment can be easily configured so as to avoid approach and crossing of the thin metal wires 25 when they are respectively connected to the signal connection leads 14a, 14b, thereby reducing the positional limitations on the external terminals. This enables increase in overall size of the package of the resin-sealed semiconductor device to be avoided even when a relatively large semiconductor chip with improved performance is mounted.

In particular, in the present embodiment, the first and second signal connection leads 14a, 14b extend to the position right under the semiconductor chip 20, and the first external terminals 15a are arranged under the semiconductor chip 20. This particularly enables a multiplicity of external terminals to be arranged within a small area even when a relatively large semiconductor chip with improved performance is mounted, whereby a resin-sealed semiconductor device can be provided which is suitable for increased density of the external terminals, and reduced size and thickness of the semiconductor device. Note that, even when the external terminals are arranged outside the semiconductor chip and the thin metal wires are connected to the signal connection leads at a position right above the respective external terminals, the signal connection leads are extended to the position under the semiconductor chip. This ensures that the sealing resin holds a large region of each signal connection lead, allowing for improved reliability.

Note that, in the present embodiment, the first and second external terminals 15a, 15b are arranged in two lines at the back surface of the resin-sealed semiconductor device. However, the external terminals may be arranged in three or more lines.

In the resin-sealed semiconductor device of the present embodiment, the first and second external terminals 15a, 15b and the die pad 11 are exposed from the back surface of the sealing resin 30. Therefore, the external terminals 15a, 15b and the die pad 11 need only be connected to the electrodes of the mounting substrate in order to mount the resin-sealed semiconductor device of the present embodiment on the mounting substrate. This allows the external terminals 15a, 15b to be directly used as external electrodes, eliminating the need to additionally provide a solder ball on each of the external terminal portions 15a, 15b for mounting on the mounting substrate. This is also advantageous in terms of man-hour and manufacturing costs.

Hereinafter, the manufacturing process of the resin-sealed semiconductor device in the present embodiment will be described. FIGS. 2A to 2E are cross-sectional views illustrating the manufacturing process of the resin-sealed semiconductor device according to the embodiment of the present invention.

Figure 2A:
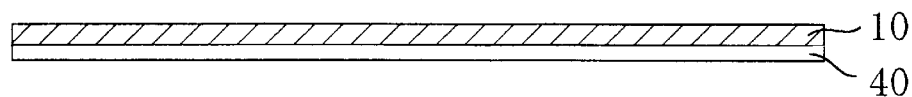
FIGS. 2A to 2E are cross-sectional views illustrating a manufacturing process of a resin-sealed semiconductor device according to an embodiment of the present invention.

In the step of FIG. 2A, a lead frame 10 is prepared, and a resin film 40 is attached to the back surface of the lead frame 10. Although the structure of the lead frame 10 is simplified in FIG. 2A, the lead frame 10 actually has a structure as described below. It should be noted that the step such as wire bonding may be conducted without attaching the resin film 40 to the lead frame in this stage, and the resin film 40 may be attached to a sealing mold in the resin sealing step.

The resin film 40 serves as a mask for preventing the sealing resin from reaching particularly the back surface of the die pad 11 (in the case where the die pad is exposed) and the back surface of the first and second signal connection leads 14a, 14b in the resin sealing step, and also serves to fill the resin under the half-etched portions Phe. The presence of the resin film 40 enables a resin bur from being formed at the back surface of the die pad 11 (in the case where the die pad is exposed) and the back surface of the first and second signal connection leads 14a, 14b. Moreover, in the resin sealing step, the sealing resin is introduced with the lower portion of each signal connection lead 14a, 14b being pressed into the resin film 40. Thus, when the resin sealing is completed, the external terminals 15a, 15b of the signal connection leads 14a, 14b project from the back surface of the sealing resin 30 by a prescribed height. In other words, a standoff as an external terminal is obtained, enabling the resin-sealed semiconductor device to be mounted on the mounting substrate without providing any solder ball as an external terminal.

The resin film 40 is desirably a film- or tape-like member that is based on a resin primarily containing polyethylene terephthalate, polyimide, polycarbonate or the like, and that has an adhesive applied thereon. The following resin film 40 is desirable: the resin film 40 is capable of being separated from the lead frame after the resin sealing by reducing the adhesive strength by heat treatment, chemical processing or UV (ultraviolet) radiation, retains appropriate physical positions (pitch) of the first and second signal connection leads 14a, 14b, withstands appropriate deformation at a high temperature in the step of connecting the thin metal wires, is recoverable at normal temperature, and is resistant to high-temperature environment in the step of connecting the thin metal wires and the resin sealing step.

An adhesive resin film primarily containing polyimide and having a thickness of 25 $\mu$m was used as the resin film 40 in the present embodiment.

The resin film used in the embodiment of the present invention is a tape formed from a polyimide film and a thermoplastic, polyimide-based adhesive attached thereto. In order to achieve the object of the present invention, this tape has an elongation of about 5 ppm/° C. to about 25 ppm/° C. at normal temperature and at a heating temperature of around 200° C., and has a thickness of about 25 $\mu$m so as to stably fit on projections of a heat plate (heating block) described below.

Figure 3A:
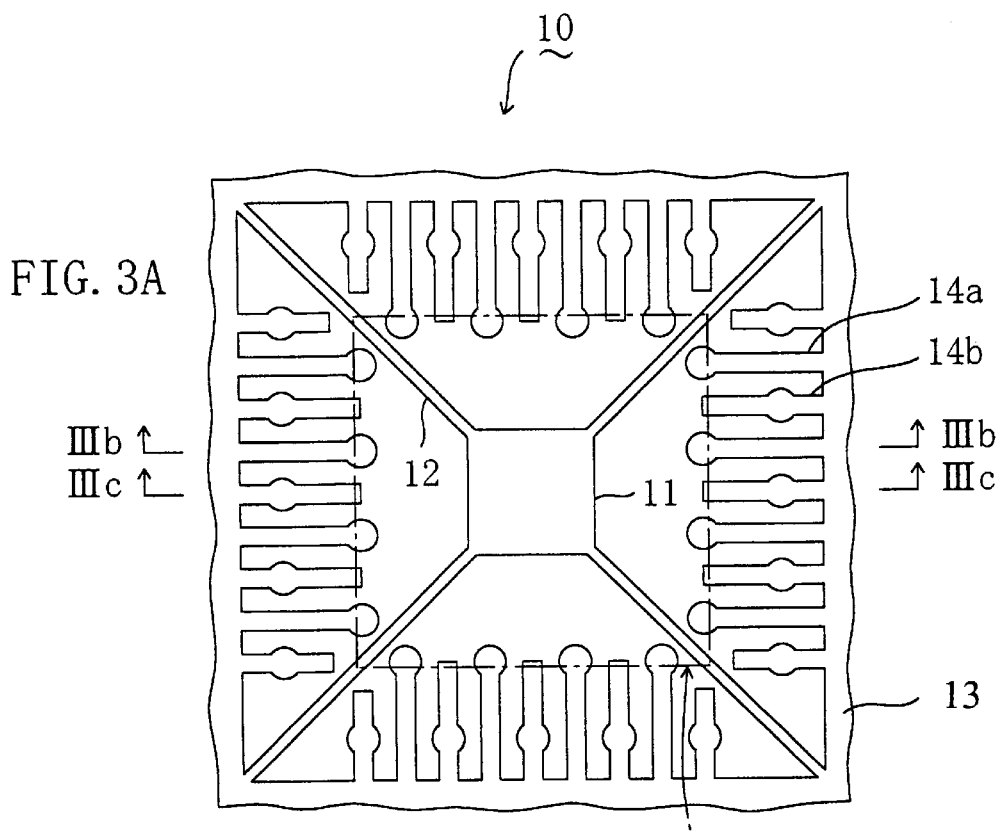
FIG. 3A is a plan view of a region of a lead frame for packaging a single semiconductor chip.
Figure 3B:
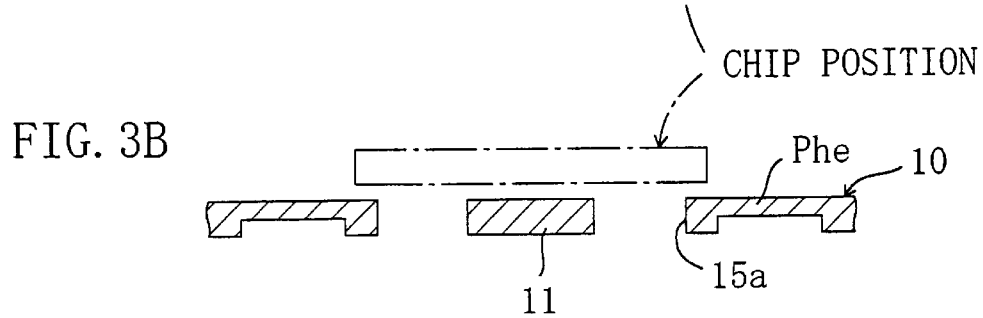
FIG. 3B is a cross-sectional view taken along line IIIb—IIIb in FIG. 3A.
Figure 3C:
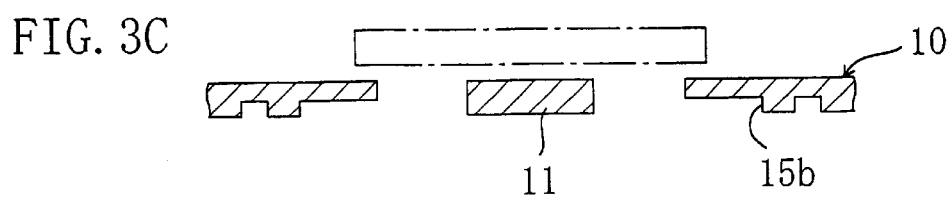
FIG. 3C is a cross-sectional view taken along line IIIc—IIIc in FIG. 3A.

FIG. 3A is a plan view of a region of the lead frame 10 for packaging a single semiconductor chip. FIG. 3B is a cross-sectional view taken along line IIIb—IIIb in FIG. 3A extending through the first signal connection leads 14a. FIG. 3C is a cross-sectional view taken along line IIIc—IIIc in FIG. 3A extending through the second signal connection leads 14b. The lead frame 10 includes an array of a multiplicity of regions for packaging a single semiconductor chip as shown in FIGS. 3A to 3C.

As shown in FIG. 3A, the lead frame 10 includes a die pad 11, an outer frame 13 surrounding the die pad 11, four suspension leads 12 extending from the outer frame 13, for supporting the die pad 11 at each corner, and first signal connection leads 14a and second signal connection leads 14b both extending from the outer frame 13 toward the die pad 11.

It should be noted that a dam bar connecting the signal connection leads 14a and 14b together may be provided along the inner side of the outer frame 13.

As shown in FIG. 3B, each of the first signal connection leads 14a has an external terminal 15a at the tip, and a region from the connection with the outer frame 13 (or dam bar) to the external terminal 15a corresponds to a half-etched portion Phe.

As shown in FIG. 3C, each of the second signal connection leads 14b has an external terminal 15b near the connection with the outer frame 13 (or dam bar), and a region from the connection with the outer frame 13 (or dam bar) to the external terminal 15b and a region from the external terminal 15b to the tip correspond to a half-etched portion Phe.

It should be noted that the term "half-etched" as used herein means that each signal connection lead 14a, 14b is partially etched away in the thickness direction, and does not mean that each signal connection lead 14a, 14b is etched away by half the thickness.

The lead frame 10 does not include any tie bar for preventing outflow of the sealing resin in the resin sealing step. The lead frame 10 of the present embodiment is a lead frame plated with three metal layers. More specifically, the lead frame 10 is a frame of a copper (Cu) material plated with a nickel (Ni) layer as underplating, a palladium (Pd) layer thereon, and a thin gold (Au) layer as the uppermost layer. It should be noted that, in addition to the copper (Cu) material, a material such as 42-alloy material may be used, and the lead frame 10 may be plated with a noble metal other than nickel (Ni), palladium (Pd) and gold (Au). Moreover, the frame is not necessarily plated with three layers.

Figure 2B:
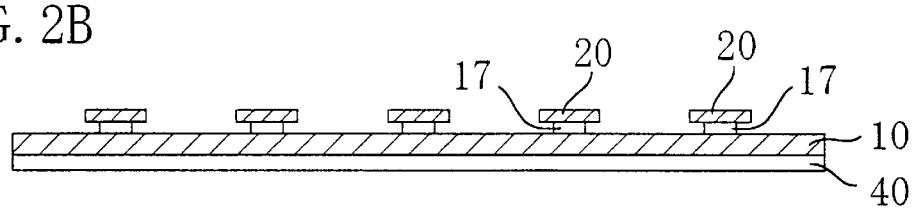

Then, in the step shown in FIG. 2B, a semiconductor chip 20 is fixed to the die pad 11 of the lead frame 10 by an adhesive layer 17. This step is a so-called die bonding step.

Figure 2C:
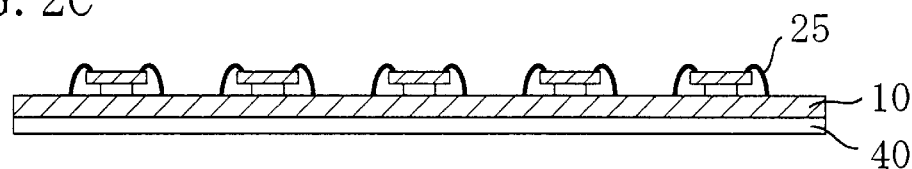

Thereafter, in the step shown in FIG. 2C, the electrode pads 21 of the semiconductor chip 20 mounted on the die pad 11 are electrically connected to the first and second signal connection leads 14a, 14b by the thin metal wires 25, respectively. At this time, the load of about 40 g to about 60 g is normally applied from a bonding tool in order to press the thin metal wires. This step is a so-called wire bonding step. This wire bonding step is conducted with the outer frame of the lead frame being pressed from above.

Figure 4A:
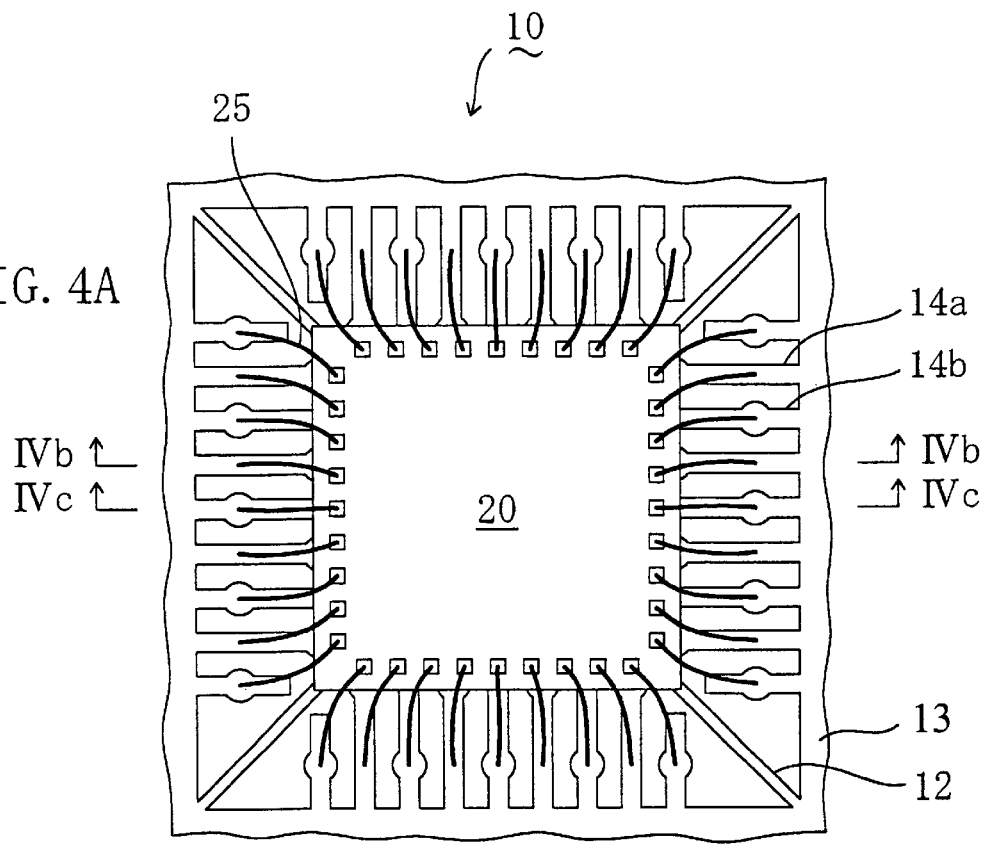
FIG. 4A is a plan view of a lead frame and a semiconductor chip after wire bonding.
Figure 4B:
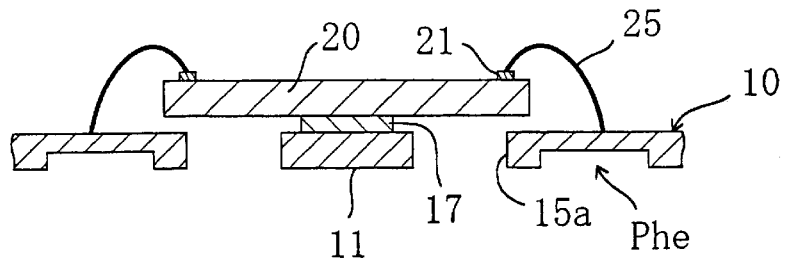
FIG. 4B is a cross-sectional view taken along line IVb—IVb in FIG. 4A.
Figure 4C:
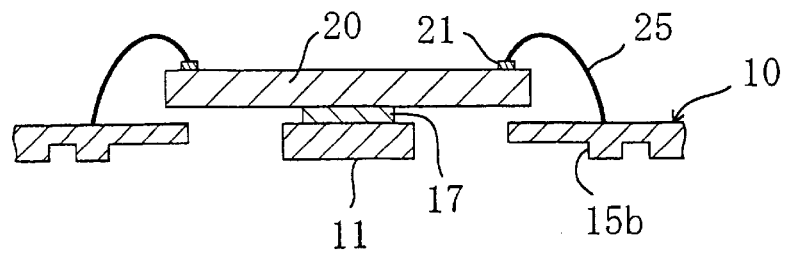
FIG. 4C is a cross-sectional view taken along line IVc—IVc in FIG. 4A.

FIG. 4A is a plan view of the lead frame and the semiconductor chip after wire bonding. FIG. 4B is a cross-sectional view taken along line IVb—IVb in FIG. 4A extending through the first signal connection leads 14a. FIG. 4C is a cross-sectional view taken along line IVc—IVc in FIG. 4A extending through the second signal connection leads 14b.

As shown in FIGS. 4A to 4C, the semiconductor chip 20 is mounted on the die pad 11 of the lead frame 10 with the adhesive layer 17 interposed therebetween. The thin metal wires 25 are connected to the first signal connection leads 14a at the half-etched portions Phe, and to the second signal connection leads 14b at a position right above the external terminals 15b. It should be noted that the thin metal wires 25 may be connected to the second signal connection leads 14b at the half-etched portions Phe.

Figure 2D:
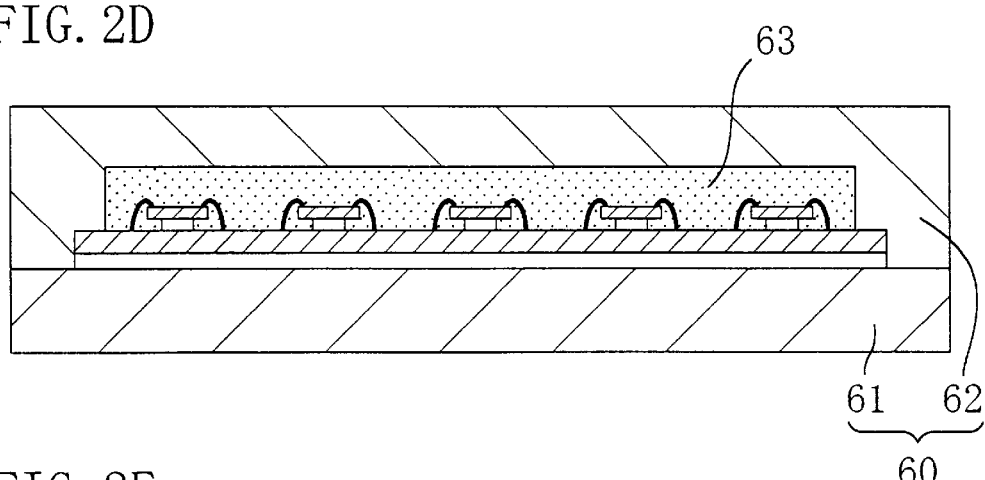

Then, in the step of FIG. 2D, the lead frame 10 with the semiconductor chips 20 mounted thereon and the resin film 40 attached thereto is mounted in a sealing mold 60 formed from a lower mold 61 and an upper mold 62 having a large die cavity 63. At this time, a plurality of semiconductor chips 20 are accommodated in a single die cavity 63. Resin sealing is conducted as follows: a sealing resin is introduced into the die cavity 63 of the sealing mold 60 with the outer frame 13 of the lead frame 10 and the resin film 40 being pressed with the sealing mold 60. The semiconductor chips 20, die pads 11, signal connection leads 14a, 14b, thin metal wires 25 and the like are thus sealed within the sealing resin 30.

Figure 2E:
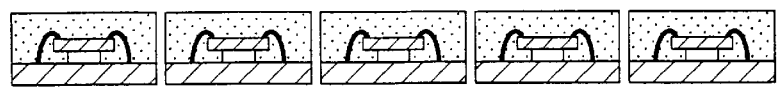

Thereafter, in the step of FIG. 2E, the resin film 40 attached to the back surface of the die pads 11, first and second signal connection leads 14a, 14b and sealing resin 30 is subjected to heat treatment, chemical processing, UV radiation or the like in order to reduce the adhesive strength of the resin film 40. The resin film 40 is then peeled off. The sealed structure is thus formed in which the respective lower surfaces of the first and second external terminals 15a, 15b and the die pad 11 are exposed from the back surface of the sealing resin 30 without being covered with the sealing resin.

Finally, the respective base ends of the first and second signal connection leads 14a, 14b connected to the outer frame 13 are cut with a cutting blade such that the cutting plane is substantially flush with the side surface of the sealing resin 30. The resin-sealed semiconductor device is thus completed in which the external terminal portions 15a, 15b and the die pad 11 are exposed from the lower surface of the sealing resin 30.

Note that, as a method for locating the upper surface of the die pad 11 higher than the upper surfaces of the first and second signal connection leads 14a, 14b, each suspension lead 12 in FIG. 3A may have a bent portion formed by pressing or the like so as to locate the die pad 11 higher than other parts of the lead frame. As a result, a gap is formed between the resin film 40 and the die pad 11, whereby the sealing resin reaches the back surface of the die pad 11 in the resin sealing step. In this case, this improves the holding power of the sealing resin 30 for holding the die pad 11, resulting in improved reliability. It should be noted that, in the case where the back surface of the die pad 11 is exposed from the sealing resin 30 as in the present embodiment, this improves heat dissipation to the mounting substrate.

Figure 5A:
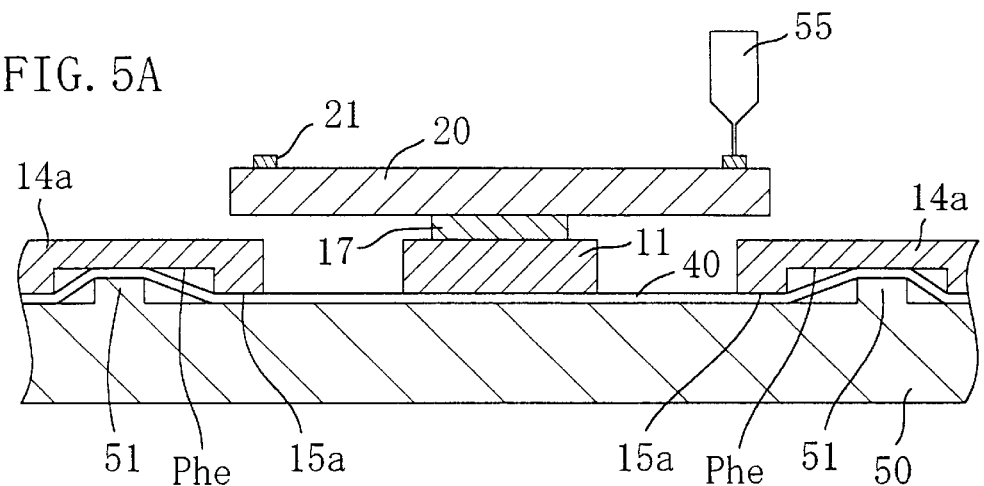
FIGS. 5A to 5C are cross-sectional views specifically illustrating the wire bonding step according to an embodiment of the present invention.
Figure 5B:
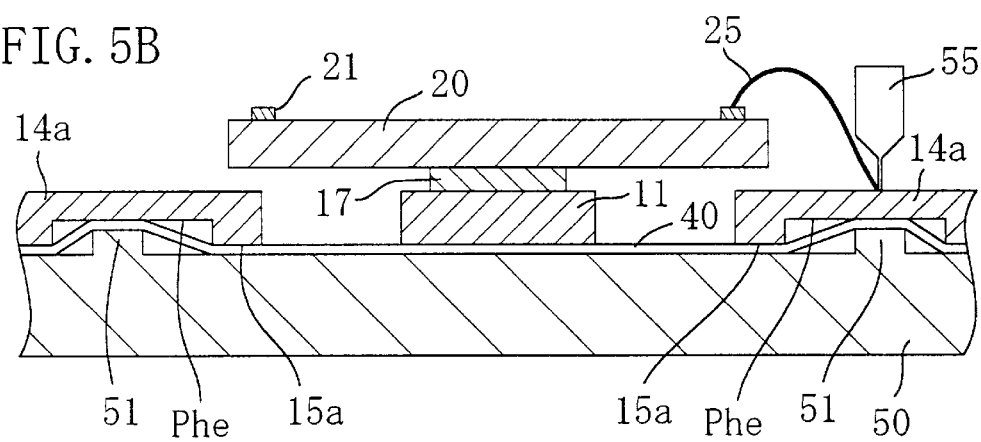
Figure 5C:
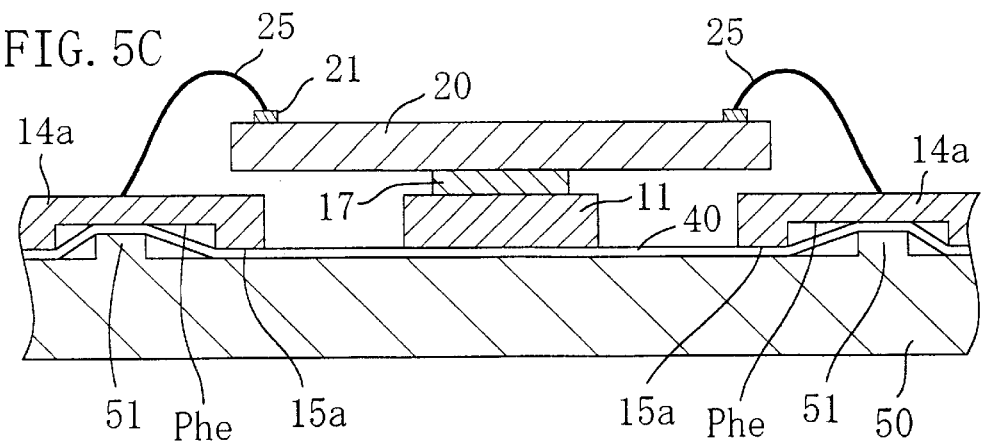

FIGS. 5A to 5C are cross-sectional views specifically illustrating the wire bonding step in the embodiment of the present invention.

First, in the step of FIG. 5A, a heat plate (heating block) 50 is prepared as a jig for conducting wire bonding. The heat plate 50 has projections 51 for supporting the half-etched portions Phe of the first signal connection leads 14a. The lead frame 10 having the resin film 40 attached thereto is mounted on the heat plate 50. One end of a thin metal wire is connected to the corresponding electrode pad 21 of the semiconductor chip 20 by a bonding tool 55 while heating the semiconductor chip 20 by the heat plate 50.

Thereafter, in the step of FIG. 5B, the other end of the thin metal wire 25 is connected to the half-etched portion Phe of the corresponding first signal connection lead 14a. At this time, the portion of the projection 51 of the heat plate 50 supporting the first signal connection lead 14a corresponds to the portion of the first signal connection lead 14a to which the other end of the thin metal wire 25 is connected. In order to connect the thin metal wires 25 to the first and second signal connection leads 14a, 14b, it is necessary to heat the respective joints and apply the pressing force of normally about 40 g to about 60 g to the thin metal wires 25 by the bonding tool 55. Since the heating plate 50 having the projections 51 is used in the present embodiment, the pressing force and the heat can be effectively applied to the joints while preventing deformation of the half-etched portions Phe even when the thin metal wires are connected to the half-etched portions Phe of the signal connection leads 14a, 14b.

Note that, in the present embodiment, the thin metal wires are connected to the second signal connection leads 14b at a position right above the respective external terminals 15b.

Therefore, the heat plate 50 does not have any projection for supporting the half-etched portions of the second signal connection leads 14b. It should be noted that, in the case where the thin metal wires are connected to the half-etched portions Phe of the second signal connection leads 14b, projections for supporting the half-etched portions of the second signal connection leads 14b are provided in the heat plate 50.

As shown in FIG. 5C, all the electrode pads 21 of the semiconductor chip 20 are respectively connected to the signal connection leads 14a, 14b by the thin metal wires 25. The wire bonding step is thus completed.

In general, in order to connect the thin metal wires 25 to the first and second signal connection leads 14a, 14b, it is necessary to heat the respective joints and apply the pressing force to the thin metal wires 25 by the bonding tool 55. When the thin metal wires are connected to the half-etched portions Phe of the signal connection leads 14a, 14b, the half-etched portions Phe may possibly be deformed. Even if the deformation is within the range of elastic deformation, bending of the half-etched portions Phe would hinder the pressing force from being effectively applied to the joints, thereby possibly degrading reliability of the connections. In the present invention, however, when the thin metal wires are connected to the half-etched portions Phe of the signal connection leads (in the present embodiment, the first signal connection leads 14a) in the wire bonding step, conducting the wire bonding by using the heat plate (jig) having the projections 51 at positions corresponding to the half-etched portions Phe ensures reliability of the connection between the thin metal wires and the signal connection leads. Moreover, in the case where the wire bonding is conducted with the resin film 40 being attached to the lead frame 10, the heat of the heat plate 50 can be efficiently transmitted to the signal connection leads (the first signal connection leads 14a) with the resin film 40 being stretched tight. This also ensures reliability of the connection by the wire bonding.

As a result, the limitations on the position of the external terminals 15a, 15b in the signal connection leads 14a, 14b can be reduced, allowing for increase in the number of external terminals. In particular, arranging the external terminals 15a of the first signal connection leads 14a under the semiconductor chip 20 as in the present embodiment allows for significant increase in the number of external terminals.

First Modification

Hereinafter, various modifications of the embodiment of the present invention will be described.

Figure 6:
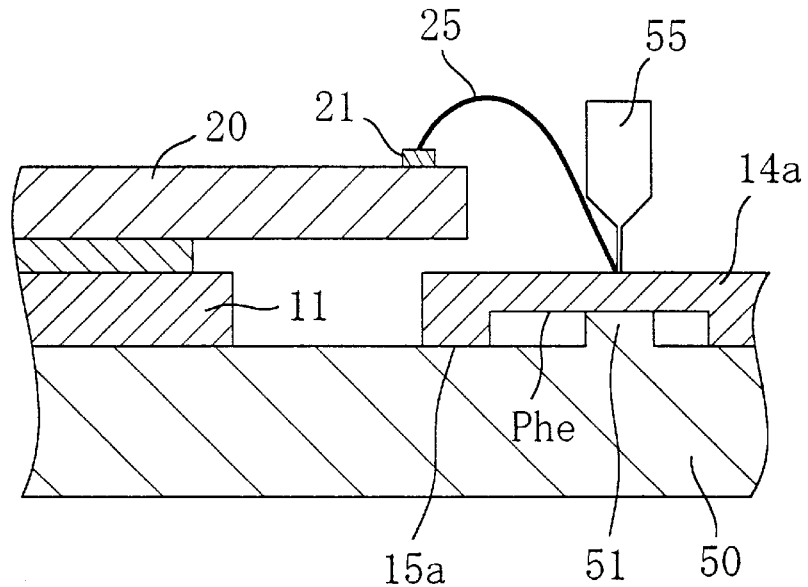
FIG. 6 is a cross-sectional view illustrating the wire bonding step according to a first modification of the embodiment of the present invention.

FIG. 6 is a cross-sectional view illustrating the case where the wire bonding step is conducted without attaching the resin film 40 to the lead frame 10 according to the first modification of the embodiment of the present invention. As shown in FIG. 6, in this case, each projection 51 of the heat plate 50 directly contact the half-etched portion Phe of the corresponding first signal connection lead 14a. This enables the pressing force of the bonding tool 55 to be applied to the thin metal wire 25 while preventing deformation of the half-etched portion Phe of the first signal connection lead 14a, ensuring reliability of the connection. Note that the wire bonding step is conducted with the outer frame of the lead frame being pressed by the jig.

Second Modification

Figure 7:
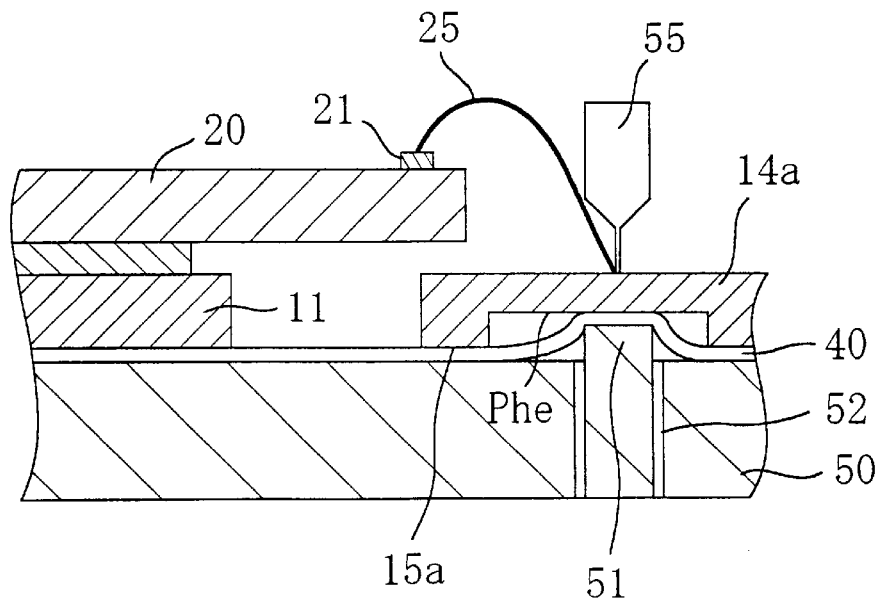
FIG. 7 is a cross-sectional view illustrating the wire bonding step according to a second modification of the embodiment of the present invention.

FIG. 7 is a cross-sectional view illustrating only the wire bonding step according to the second modification of the embodiment of the present invention.

In the present modification, wire bonding is conducted using a heat plate 50 having a vacuuming hole 52 near the projection 51. At this time, the jig presses the outer frame of the lead frame, but not up to the upper portions of the signal connection leads 14a, 14b. However, the resin film 40 around the projection 51 is pulled downward by vacuuming, enabling slacking in the resin film 40 to be effectively eliminated.

Third Modification

Figure 8:
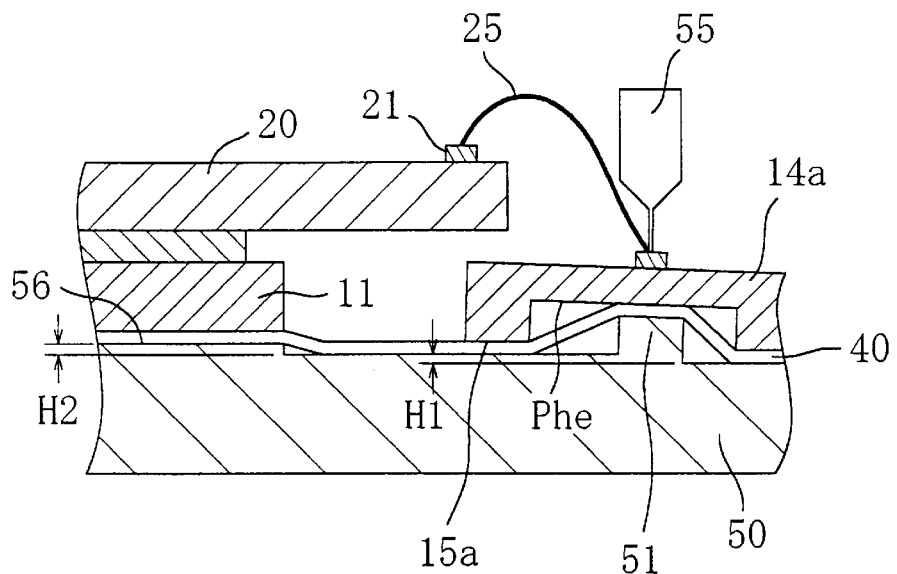
FIG. 8 is a cross-sectional view illustrating the wire bonding step according to a third modification of the embodiment of the present invention.

FIG. 8 is a cross-sectional view illustrating only the wire bonding step according to the third modification of the embodiment of the present invention.

A heat plate 50 used in the present modification is tilted such that the upper surface of the region inside the projection 51 is located higher than that of the region outside the projection 51 by a height H1. Moreover, the upper surface of the region under the die pad 11 is located higher than that of the peripheral region by a height H2. In other words, the upper surface of the region of the heat plate 50 under the die pad 11 is located higher than that of the region outside the projection 51 by the height (H1+H2). This height (H1+H2) is set so that the resin film 40 hardly slacks when stretched by thermal expansion. At this time, the outer frame of the lead frame is pressed by the jig. Thus stretching the resin film 40 to the minimum required degree enables the relative positions (pitch) of the external terminals 15a, 15b after resin sealing to be stably made within the design range while suppressing slacking in the resin film 40.

Fourth Embodiment

Figure 9:
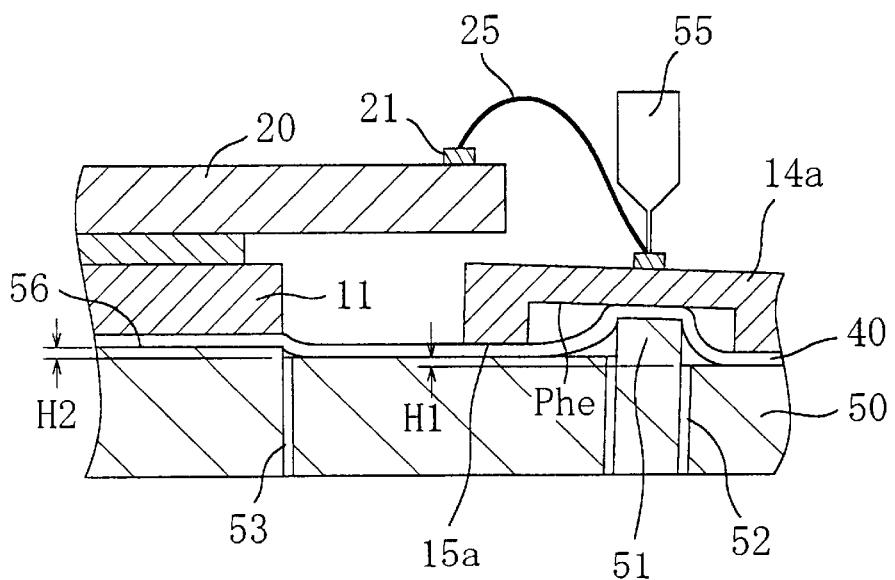
FIG. 9 is a cross-sectional view illustrating the wire bonding step according to a fourth modification of the embodiment of the present invention.

FIG. 9 is a cross-sectional view illustrating only the wire bonding step according to the fourth modification of the embodiment of the present invention.

In the present modification, wire bonding is conducted using a heat plate 50 which includes, in addition to the structure of the third modification, a vacuuming hole 52 near the projection 51 and a vacuuming hole 53 near the projection 56. The resin film 40 around the projections 51, 56 is pulled downward, enabling slacking in the resin film 40 to be effectively eliminated.

Fifth Modification

Figure 10:
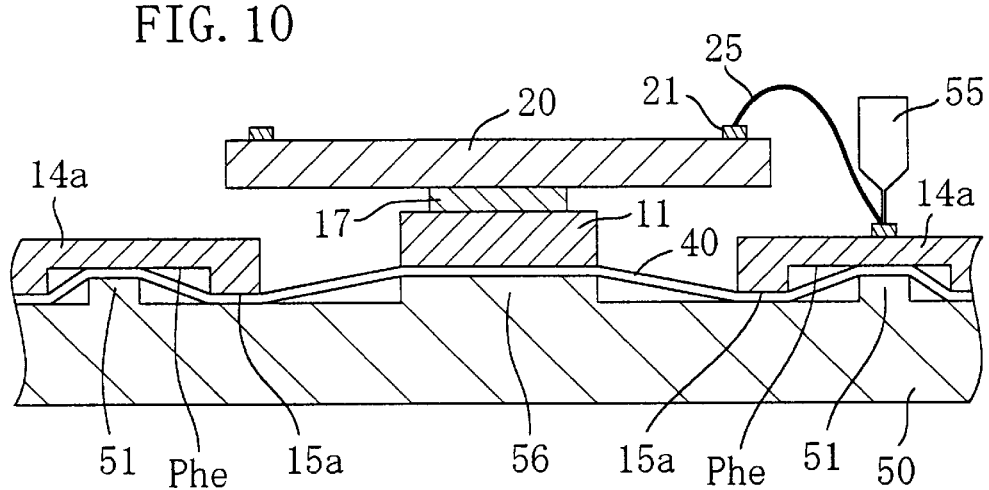
FIG. 10 is a cross-sectional view illustrating the wire bonding step according to a fifth modification of the embodiment of the present invention.

FIG. 10 is a cross-sectional view illustrating only the wire bonding step according to the fifth modification of the embodiment of the present invention.

A heat plate 50 used in the present modification has a projection 56 under the die pad 11 in addition to the projections 51, so that the upper surface of the region under the die pad 11 is located higher than the upper surfaces of the other regions. It should be noted that the heat plate 50 in the present modification is not tilted such that the upper surface of the region inside the projection 51 is located higher than that of the region outside the projection 51 by the height H1 as in the third modification. The outer frame of the lead frame is pressed by the jig.

In the present modification as well, the resin film 40 is raised upward by the projections 51, 56, enabling slacking in the resin film 40 to be effectively eliminated.

Sixth Modification

Figure 11:
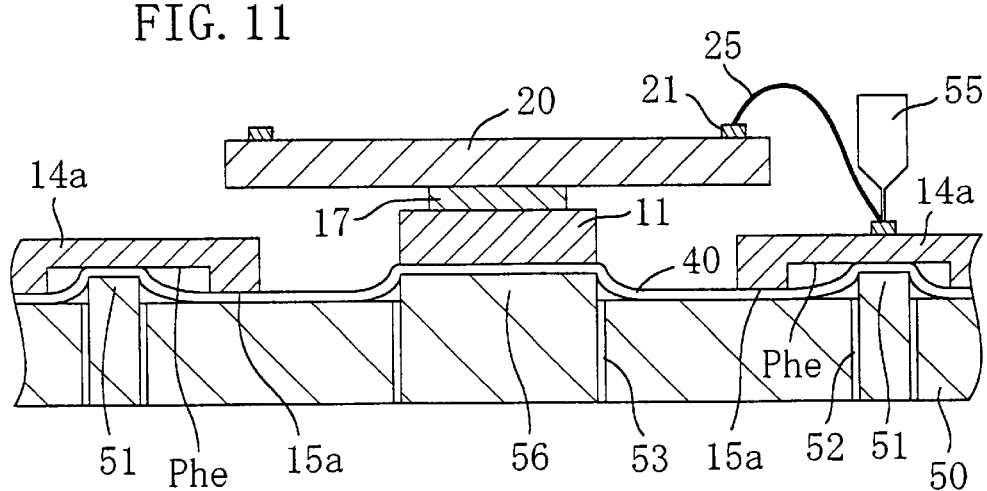
FIG. 11 is a cross-sectional view illustrating the wire bonding step according to a sixth modification of the embodiment of the present invention.

FIG. 11 is a cross-sectional view illustrating only the wire bonding step according to the sixth modification of the embodiment of the present invention.

In the present modification, wire bonding is conducted using a heat plate 50 that includes, in addition to the structure of the fifth modification, a vacuuming hole 52 near the projection 51 and a vacuuming hole 53 near the projection 56. The outer frame of the lead frame is pressed by the jig. The resin film 40 around the projections 51, 56 is pulled downward by vacuuming, enabling slacking in the resin film 40 to be effectively eliminated and also suppressing separation of the signal connection leads 14a, 14b from the heat plate 50 that would otherwise occur as the signal connection leads 14a, 14b are pulled by the resin film 40.

Seventh Modification

Figure 12:
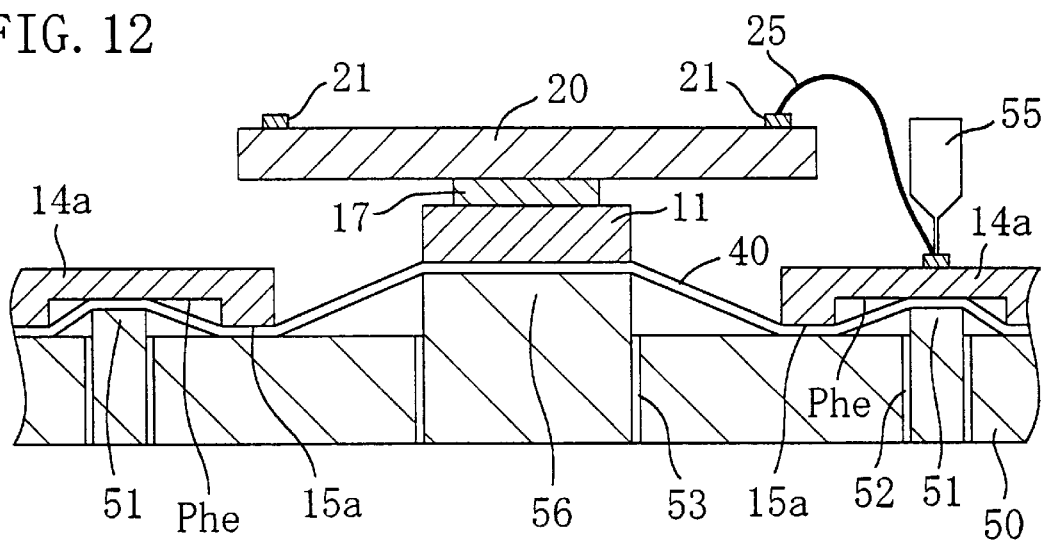
FIG. 12 is a cross-sectional view illustrating the wire bonding step according to a seventh modification of the embodiment of the present invention.

FIG. 12 is a cross-sectional view illustrating only the wire bonding step according to the seventh modification of the embodiment of the present invention.

A heat plate 50 used in the present modification includes, in addition to the projections 51, a tall projection 56 under the die pad 11, so that the upper surface of the region under the die pad 11 is located much higher than the upper surfaces of the other regions. The protruding amount of the projection 56 is set so that the suspension leads 12 in FIG. 3A are plastically deformed to locate the die pad 11 higher than other parts of the lead frame.

On the other hand, in the third to sixth modifications, the projection 56 raises the die pad 11 high during the wire bonding. After the wire bonding, however, the die pad 11 springs back so that the lower surface of the die pad 11 is substantially flush with the lower surface of each signal connection lead 14a, 14b. In other words, in the third to sixth modifications, the height of the projection 56 is set so that the suspension leads 12 in FIG. 3A are only elastically deformed without being plastically deformed in the wire bonding step. At this time, the outer frame of the lead frame is pressed by the jig.

The heat plate 50 has a vacuuming hole 52 near the projection 51 and a vacuuming hole 53 near the projection 56.

Accordingly, in the present modification, the lower surface of the die pad 11 is separated from the resin film 40 in the resin sealing step after the wire bonding. As a result, the sealing resin reaches the lower surface of the die pad 11 in the resin sealing step. This improves the holding power of the sealing resin 30 for holding the die pad 11, and also enables introduction of moisture and the like through the interface between the die pad 11 and the sealing resin 30 to be suppressed. In other words, in the case where the die pad 11 is to be located higher than the signal connection leads 14a, 14b, the present modification enables operations such as pressing the lead frame 10 in advance to be omitted, allowing for reduced manufacturing costs.

Moreover, according to the present modification, the resin film 40 around the projections 51, 56 is pulled downward, enabling slacking in the resin film 40 to be effectively eliminated and also suppressing separation of the signal connection leads 14a, 14b from the heat plate 50 that would otherwise occur as the signal connection leads 14a, 14b are pulled by the resin film 40.

Eighth Modification

Figure 13:
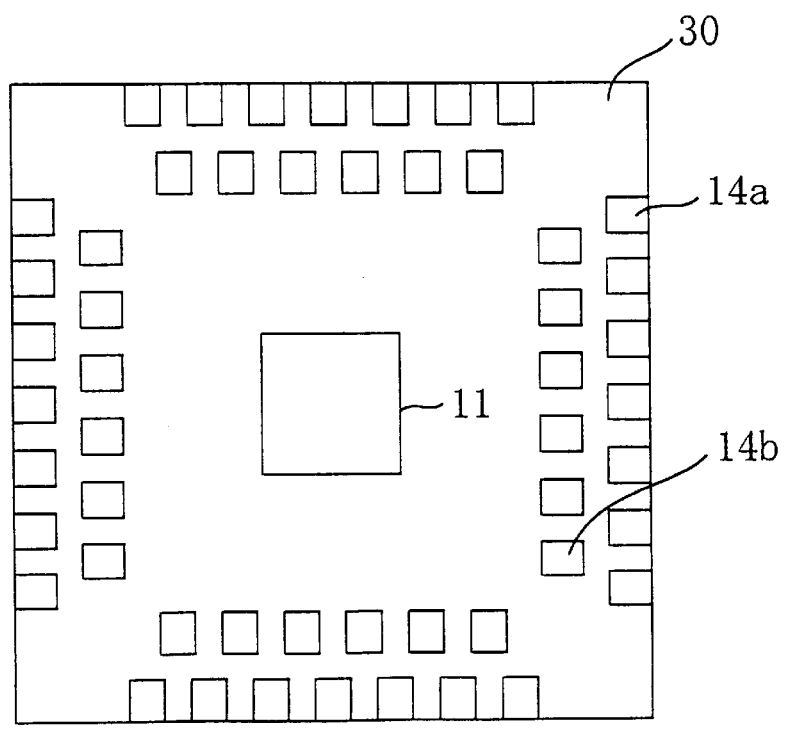
FIG. 13 is a bottom view of a resin-sealed semiconductor device according to an eighth modification of the embodiment of the present invention.

FIG. 13 is a bottom view of a resin-sealed semiconductor device according to the eighth modification regarding a method for arranging the signal connection leads 14a, 14b. As shown in FIG. 13, in this example, the external terminals 15a, 15b is approximately square in transverse section. The outer side surface of each first external terminal 15a is approximately flush with the side surface of the sealing resin 30. The second signal connection leads 14b are arranged in line at a predetermined distance inward from the side surface of the sealing resin 30.

According to the present modification, the external terminals are arranged as outside as possible, allowing for reduction in package size while increasing the number of external terminals.

As has been described above, the embodiment of the present invention and the modifications thereof enable the thin metal wires to be connected to the half-etched portions Phe. This allows for stable production of a resin-sealed semiconductor device with reduced size and thickness and improved performance, making it possible to deal with various semiconductor devices.

Moreover, the step of attaching the resin film 40 to the lead frame 10 can be used in common regardless of the size of the semiconductor device, the number of lands, and the pitch, thereby improving the productivity. This enables connection of the thin metal wires in a semiconductor device incorporating a die pad therein and having a small distance (pitch) between the external terminals, or a semiconductor device having an exposed die pad and having a small distance (pitch) between the external terminals.

Further, according to the manufacturing method of the present embodiment, a plurality of semiconductor chips are mounted in a large die cavity, and after sealing, the resultant structure is cut into resin-sealed semiconductor devices each incorporating a single semiconductor chip. This enables improvement in productivity and also enables the use of a common mold sized for the resin-sealed semiconductor devices. Moreover, the resin film 40 is attached in advance to the lower surface of the die pad 11, the back surfaces of the first and second signal connection leads 14a, 14b (the first and second external terminals 15a, 15b) and the like prior to the resin sealing step. As a result, the sealing resin 30 will not reach these surfaces in the sealing step, preventing a resin bur from being formed at the back surfaces of the die pad 11 and the first and second external terminals 15a, 15b.

Moreover, the use of a method for resin-sealing a multiplicity of semiconductor chips in a common die cavity eliminates the need for the step of cutting with a mold after the resin sealing step. Accordingly, the signal connection leads 14a, 14b will not be separated due to the cutting stresses applied to the interface between the sealing resin 30 and the signal connection leads 14a, 14b. Further, the following problems can be prevented: reduction in yield in the cutting step due to falling of a resin bur produced at each cutting plane of the signal connection leads 14a, 14b; poor contact in the inspection step; poor connection due to falling of a resin bur during mounting; and generation of defects resulting from wear of the cutting mold.

Note that the present invention is not limited to the method of the above embodiment. For example, various combinations of the modifications of the present embodiment allow for reliable selection of both the number of external terminals arranged in a matrix and the arrangement thereof in a semiconductor device, which are suitable for the size of a semiconductor chip and the number of pads.

The present invention is also applicable to a die pad portion of a semiconductor device of SON (small outline non-leaded package) and QFP incorporating a die pad therein. In this case, connection between the semiconductor chip and the thin metal wires is improved.

Moreover, although increasing the costs, solder balls may be provided in order to manufacture a narrower-pitch semiconductor device and to mount such a semiconductor device on a printed board.

What is claimed is:

1. A method for manufacturing a resin-sealed semiconductor device, comprising the steps of:
    (a) preparing a lead frame including a die pad on which a semiconductor chip is mounted, a frame arranged outside the die pad, and a plurality of leads extending from the frame toward the die pad and each including a half-etched portion;
    (b) mounting on the die pad of the lead frame the semiconductor chip including a plurality of electrode pads;
    (c) mounting the lead frame having the semiconductor chip mounted thereon on a jig including projections for supporting the half-etched portions of the leads to which thin metal wires are respectively connected out of the half-etched portions of the plurality of leads;

(d) connecting the electrode pads of the semiconductor chip to the plurality of leads by the thin metal wires, respectively; and (e) resin-sealing the semiconductor chip, the die pad, the leads and the thin metal wires with a resin film being pressed against a lower surface of the lead frame, wherein, in the step (d), the half-etched portions to which the thin metal wires are connected are supported by the projections of the jig, respectively, wherein the resin film is mounted to the lower surface of the lead frame prior to the step c), and the step (d) is conducted with the resin film being mounted to the lower surface of the lead frame, and wherein, in the step (d), the jig including a vacuuming opening is used to draw the resin film toward a surface of the jig by vacuuming.

2. The method according to claim 1, wherein the step (d) is conducted with a heated jig.

3. A method for manufacturing a resin-sealed semiconductor device, comprising the steps of:

(a) preparing a lead frame including a die pad on which a semiconductor chip is mounted, a frame arranged outside the die pad, and a plurality of leads extending from the frame toward the die pad and each including a half-etched portion;

(b) mounting on the die pad of the lead frame the semiconductor chip including a plurality of electrode pads;

(c) mounting the lead frame having the semiconductor chip mounted thereon on a jig including projections for supporting the half-etched portions of the leads to which thin metal wires are respectively connected out of the half-etched portions of the plurality of leads;

(d) connecting the electrode pads of the semiconductor chip to the plurality of leads by the thin metal wires, respectively; and (e) resin-sealing the semiconductor chip, the die pad, the leads and the thin metal wires with a resin film being pressed against a lower surface of the lead frame, wherein, in the step (d), the half-etched portions to which the thin metal wires are connected are supported by the projections of the jig, respectively, wherein the resin film is mounted to the lower surface of the lead frame prior to the step c), and the step (d) is conducted with the resin film being mounted to the lower surface of the lead frame, wherein, in the step (d), the die pad of the lead frame is raised upward.

4. The method according to claim 1, wherein a material having a thermal expansion coefficient of 5 to 25×10 ppm/° C. is used as the resin film.

5. A method for manufacturing a resin-sealed semiconductor device, comprising the steps of:

(a) preparing a lead frame including a die pad on which a semiconductor chip is mounted, a frame arranged outside the die pad, and a plurality of leads extending from the frame toward the die pad and each including a half-etched portion;

(b) mounting on the die pad of the lead frame the semiconductor chip including a plurality of electrode pads;

(c) mounting the lead frame having the semiconductor chip mounted thereon on a jig including projections for supporting the half-etched portions of the leads to which thin metal wires are respectively connected out of the half-etched portions of the plurality of leads;

(d) connecting the electrode pads of the semiconductor chip to the plurality of leads by the thin metal wires, respectively; and (e) resin-sealing the semiconductor chip, the die pad, the leads and the thin metal wires with a resin film being pressed against a lower surface of the lead frame, wherein, in the step (d), the half-etched portions to which the thin metal wires are connected are supported by the projections of the jig, respectively, wherein, in the step (a) or (c), an upper surface of the die pad of the lead frame is located higher than respective upper surfaces of the leads.

6. The method according to claim 1, wherein, in the step (a), the plurality of leads of the lead frame are arranged such that respective lower portions of the plurality of leads except for the half-etched portions are arranged in a plurality of lines when viewed from a back surface of the sealing resin.

* * * * *